April 17, 1973 B. W. HOWLETT 3,728,165

METHOD OF FABRICATING A COMPOSITE SUPERCONDUCTOR

Filed Oct. 19, 1970

United States Patent Office 3,728,165
Patented Apr. 17, 1973

3,728,165
METHOD OF FABRICATING A COMPOSITE SUPERCONDUCTOR

Brian Wilfred Howlett, Newbury, England, assignor to United Kingdom Atomic Energy Authority, London, England Filed Oct. 19, 1970, Ser. No. 82,414
Claims priority, application Great Britain, Oct. 27, 1969, 52,623/69
Int. Cl. C21d
U.S. Cl. 148—11.5 R 4 Claims

ABSTRACT OF THE DISCLOSURE

A15 superconductivity compounds of general formula $A_3B$ are manufactured by forming an alloy of B in a carrier, contacting the alloy with A and heat treating so that a solid state reaction occurs between A and B.

BACKGROUND OF THE INVENTION

The invention relates to superconducting members and methods of manufacture thereof.

By superconducting member is meant a member which will exhibit superconductivity when its temperature is lowered below its critical temperature. Materials of particular interest in this field are those which have comparatively high critical temperatures and comparatively high critical magnetic fields. Such materials are binary compounds, such as niobium stannide, $Nb_3Sn$, and, of particular interest recently, ternary compounds such as the niobium-aluminium-germanium, $Nb_3(Al_{0.8}Ge_{0.2})$.

The manufacture of such compounds into the form of superconducting members suitable for winding magnet coils is rendered difficult by their brittleness. Thus, for example, one presently employed technique of making a ribbon of $Nb_3Sn$ involves depositing tin onto a preformed ribbon of niobium and then heating to 925° C. to 1050° C. at which temperature the tin is liquid and reacts with the niobium to form $Nb_3Sn$. An alternative procedure is to co-reduce onto a substrate a mixture, in appropriate proportions, of halides of niobium and tin.

SUMMARY OF THE INVENTION

The invention provides a method of manufacturing a superconducting member comprising the steps of forming an alloy consisting essentially of a carrier material and at least one element from the group consisting of aluminium, gallium, indium, silicon, germanium and tin, contacting the alloy with a base material consisting essentially of niobium or vanadium and heat treating to cause a solid state reaction between the niobium or vanadium and the element or elements from the said group whereby a superconducting compound is formed therewith, the carrier material being so selected as to be substantially non-reactive with the base material under the heat treatment, and the heat treatment temperature being controlled for avoiding melting of the alloy at any stage during the reaction.

It is to be understood that references to the alloy essentially consisting of a carrier material and at least one element from the said group are intended to include the possibility that the carrier material and the element or elements used in preparing the alloy may either be pure or incorporate other elements in the form of acceptable impurities or additives or diluents which do not unacceptably affect the reaction between the niobium or vanadium with the element to form the superconducting compound.

It is further important to observe that the selection of carrier material in relation to the chosen element or elements of the aforesaid group and the concentration of the element or elements in the carrier material are subject to the constraint that no unwanted compound is stable in that portion of the ternary or quaternary equilibrium diagram which is involved in the reaction between the niobium or vanadium and the composite material.

Similarly references to the base material essentially consisting of niobium or vanadium are intended to include use of niobium or vanadium either pure or including acceptacle impurities or having an additive or diluent which does not unacceptably affect the reaction between the niobium or vanadium with the element from the aforesaid group to form the superconducting compound.

It is envisaged that additives may be desirable in certain circumstances. For example, up to 25 percent by weight of tantalum may be included in niobium and improve significantly the mechanical properties of the niobium without seriously affecting the superconducting properties of the compound formed by the aforesaid method.

Preferably the alloy at the heat treatment temperature comprises a solid solution of the element or elements from the said group in the carrier. Preferably the carrier metal essentially consists of copper, silver or gold.

According to the invention, the reaction conditions are such as to form an intermetallic compound between the niobium or vanadium base material and the element or elements, which compound has a crystal structure designated A15, such as, for example, $Nb_3Sn$.

In one method according to the invention, the base material together and in contact with the carrier material is mechanically treated, for example by rolling, drawing, swaging, extruding or forging, or combination of these treatments, to form the desired shape and general dimensions of the final superconducting member prior to carrying out the heat treatment under which the base material reacts with the element or elements from the said group.

The invention includes a superconducting member made by a method as aforesaid.

The invention further includes a superconducting member essentially consisting of niobium or vanadium base material in contact with a composite material essentially consisting of a carrier material and at least one element from the group comprising aluminium, gallium, indium, silicon, germanium, and tin, wherein at least part of the base material is combined with the element or elements of the group forming a superconducting compound.

BRIEF DESCRIPTION OF THE DRAWINGS

Specific methods of manufacturing superconducting members and specific constructions of superconducting members embodying the invention will now be described by way of example and with reference to the accompanying drawings, in which.

DESCRIPTION OF PREFERRED EMBODIMENTS

Figure 1:
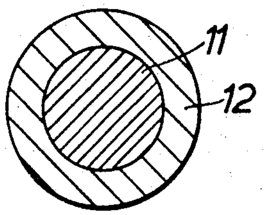
FIG. 1 and 2 are diagrammatic cross-sections of respectively first and second forms of superconducting member.

In the example illustrated by FIG. 1, a slug of niobium 11 is coated with a copper-tin bronze 12, that is a solid solution of tin in copper. The coated slug is then formed into the desired final shape of superconducting member by a mechanical forming technique. For example an extended wire may be formed by drawing or by extrusion through a die.

The formed member is then heat treated, when the niobium reacts with the tin in the copper and forms a compound layer of the superconductor $Nb_3Sn$ at the interface between the niobium and the bronze coating.

Figure 2:
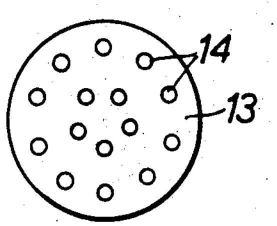
Figure 6:
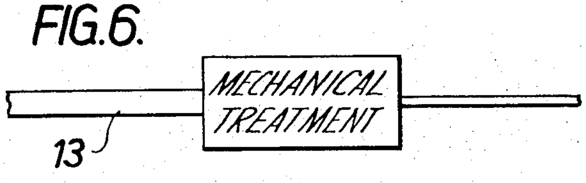
FIG. 6 represents diagrammatically a step in the manufacture.

In the example illustrated by FIG. 2, a billet of copper-tin bronze 13 is drilled with a plurality of holes into which are inserted rods 14 of niobium. The billet is then drawn or extruded (FIG. 6) to form an extended cable comprising a copper-tin bronze matrix carrying a plurality of niobium filaments. Heat treatment as in the example illustrated in FIG. 1 produces $Nb_3Sn$ compound layer at all the interfaces between the niobium filaments and the matrix material. In this way, a cable with a plurality of $Nb_3Sn$ superconductor filaments is formed by a straightforward mechanical forming and heat treatment process.

In practice it is found that with small enough filament diameter of the niobium, the heat treatment can reasonably be continued to secure complete reaction between the niobium and the tin, that is to achieve single phase $Nb_3Sn$ with consequent good superconducting properties. Niobium filament diameters of the order of 5 to 10 microns are appropriate for this. Larger diameters may be acceptable but would require rather lengthly heat treatment.

The methods of manufacture described with reference to FIGS. 1 and 2 have the following important, advantageous features:

The copper-tin bronze can be made with mechanical properties closer to those of niobium than tin alone. By incorporating the tin into copper, at an appropriate concentration, the tin-copper bronze remains solid at the reaction heat treatment temperature. Thus the reaction occurs as a solid state reaction. These two factors together make possible the formation of the desired final size and shape of superconducting member by a simple mechanical forming operation applied simultaneously to all the components which go into the manufacture.

The solid state reaction is more controlled than a reaction between niobium and liquid tin and gives rise to a more desirable fine-grained structure of the $Nb_3Sn$ layer.

A further remarkable feature of the technique described above has been observed. For the formation of $Nb_3Sn$ conventionally temperatures of between 925° C. and 1050° C. have been employed. At lower temperatures there is excess formation of undesirable compounds $Nb_6Sn_5$ or $NbSn_2$. However, the controlling effect of the solid state reaction in the methods described above appears to have the effect of inhibiting formation of these undesirable compounds $Nb_6Sn_5$ and $NbSn_2$ even if a reaction temperature significantly lower than 925° C. is employed. Experiments have shown that a reaction temperature of 700° C. may be employed and indicate that even lower temperatures may possibly be acceptable. It has been discovered that the reaction temperature and the ultimate critical temperature and superconducting current carrying capacity of the superconducting compound are related. The lower the reaction temperature, within the limits of securing a reaction at a reasonable rate, the higher the critical temperature and superconducting current carrying capacity. These factors are shown by the accompanying Table I, which also shows the improvement in reaction rate with increase in concentration of tin in the initial copper-tin bronze.

This is a particularly significant feature because a limit upon the concentration of tin within the copper, and thus a limit upon the amount of $Nb_3Sn$ that may be formed, is imposed by the requirement that the bronze should not melt at the reaction temperature. It will be appreciated that the higher the concentration of tin in the copper the lower will be the temperature at which melting commences. Stated more accurately, the upper temperature for the reaction is limited to the solidus of the copper-tin system. Desirably the concentration of tin should be sufficient to react with all the niobium present. A further constraint upon the concentration of tin is imposed by the requirement that $Nb_3Sn$ is to be stable, but the other, unwanted, niobium-tin compounds are to be unstable, in the ternary equilibrium diagram involved in the reaction between the niobium and the bronze. In practice, fabrication difficulties are generally encountered in trying to increase tin concentration before this constraint becomes effective.

A further advantage of the methods described is that, using copper-tin bronze, one secures with a simple fabrication step a matrix of a normal conductor in contact with a superconductor. Such a configuration is particularly desirable for controlling flux jumping in superconducting coils. It is, however, envisaged that the redutcion in the normal conductivity of the copper by the presence of small quantities of tin remaining in the copper after the reaction may be such that an additional layer of pure copper would have to be added after forming the $Nb_3Sn$. This may be achieved, for example, by cabling the conductor with pure copper, by copper plating the conductor after heat treatment, or by flattening the conductor prior to the heat treatment and soldering pure copper onto it after the heat treatment.

Figure 3:
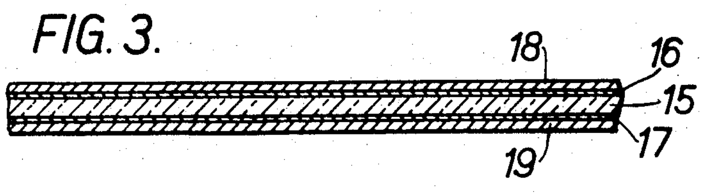
FIGS. 3, 4 and 5 are diagrammatic part longitudinal sections of a third form of superconducting member in various stages of its manufacture.
Figure 4:
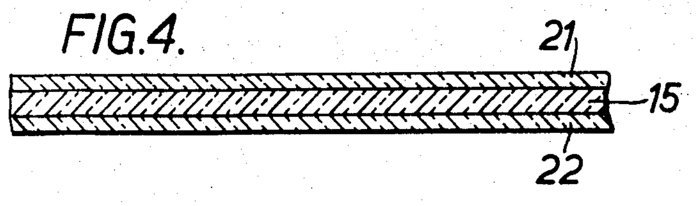
Figure 5:
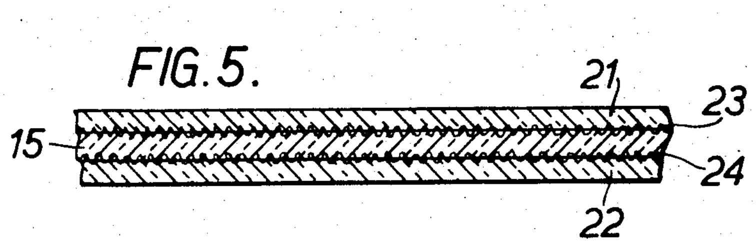

FIGS. 3, 4 and 5 illustrate three steps in an alternative method of fabrication, used in this example for forming a ribbon superconducting member.

Referring to FIG. 3, a ribbon of niobium 15 is first coated with a layer of tin 16, 17 on each side. The tin layers are then coated with copper layers 18, 19. This sandwich structure is then heated.

Upon heating, the tin reacts first with the copper, which it does much more readily at low temperatures than it does with niobium. There is thus formed layers 21, 22 (FIG. 4) of copper-tin bronze upon the niobium ribbon 15.

As the temperature is further raised, the situation is exactly equivalent to that of the examples described with reference to FIGS. 1 and 2. A solid state reaction occurs between the niobium and the tin in the copper-tin bronze. FIG. 5 illustrates the formation of $Nb_3Sn$ layers 23, 24 at the interfaces between the niobium and the bronze.

This method does not have the above-mentioned advantage of simple mechanical fabrication of all the component materials into the final size and shape of superconducting member desired. This method does, however, have the advantages of fine grain $Nb_3Sn$ formation and permissible lower reaction temperature because the $Nb_3Sn$ formation occurs as a solid state reaction.

For simplicity of description the methods, and superconducting members formed, have been described for the $Nb_3Sn$ system. The same basic considerations apply, however, to the formation of other compounds with the A15 crystal structure, that is to say compounds of the general formula $A_3B$ where A comprises niobium or vanadium and B comprises one or more of the elements aluminium, gallium, indium, silicon, germanium and tin. When two of the elements in this list are selected to comprise "B" and thus form a ternary compound, preliminary investigations indicate that improved results may be achieved if one of the elements is selected from the group aluminium, gallium and indium, and the other element is selected from the group silicon, germanium and tin.

It is important that the carrier material is one which readily forms a solid solution with the B element but is substantially insoluble with niobium or vanadium. As explained above, it is also important, in choosing the carrier material in relation to the B element or elements, that regard is had to the equilibrium system at the reaction temperature. Copper is a most suitable material as carrier in the $Nb_3Sn$ manufacture described, but copper may be unsatisfactory for $Nb_3Al$, where silver or gold carrier material may have to be considered.

Whilst, as mentioned above, the basic considerations described for the method of forming the $Nb_3Sn$ system apply for the formation of the other mentioned $A_3B$ compounds, it will be appreciated that the differing phase diagram characteristics of the other systems will impose somewhat different requirements to be met by the heat treatment and also impose different requirements on the allowed level of the B element in the carrier material. In this respect, an even greater significance attaches to the factor mentioned above, namely the controlling effect of achieving a solid state reaction between the "B" element or elements and the "A" element. Thus, the undesirable $Nb_2Al$ phase of the niobium aluminium system is stable up to around 1870° C. The problems of controlling unwanted reactions at this temperature are extremely serious and this imposes considerable difficulty upon the manufacture of ternary compound $Nb_3(Al_{0.8}Ge_{0.2})$, the ternary having, at present, the highest known critical temperature. The above described controlling effect of the solid state reaction is expected to enable formation of the desired phase in the systems including aluminium or silicon at significantly lower temperatures, for example, possibly as low as 700° C. or 800° C.

The invention is not restricted to the details of the foregoing examples. For instance, drawing and extruding are mentioned as mechanical forming methods. Rolling, swaging, or forging may be used alternatively or additionally where appropriate.

TABLE I

| Atomic percentage of Sn in initial Cu/Sn bronze | Reaction time (hours) | Reaction temperature (° C.) | Thickness in microns of $Nb_3Sn$ formed | Superconductivity critical temperature of product (° K.) |
|---|---|---|---|---|
| 2 | 10 | 940 | 2.2 | 14.3 |
| 2 | 10 | 900 | 1.4 | 15.7 |
| 2 | 10 | 800 | 0.7 | 17.2 |
| 2 | 10 | 750 | 0.6 | 18.4 |
| 2 | 10 | 700 | 0.4 | |
| 4 | 10 | 900 | 5.8 | |
| 4 | 10 | 840 | 3.5 | |
| 6 | 10 | 825 | 6.0 | |
| 6 | 10 | 800 | 4.0 | 18.7 |

I claim:

1. A method of manufacturing a superconducting member comprising the steps of forming an alloy consisting essentially of a carrier material and at least one element from the group consisting of aluminium, gallium, indium, silicon, germanium and tin, contacting the alloy with a base material consisting essentially of niobium or vanadium and heat treating to cause a solid state reaction between the niobium or vanadium and the element or elements from the said group whereby a superconducting compound is formed therewith, the carrier material being so selected as to be substantially non-reactive with the base material under the heat treatment, and the heat treatment temperature being controlled for avoiding melting of the alloy at any stage during the reaction.

2. A method as claimed in claim 1, wherein the alloy at the heat treatment temperature comprises a solid solution of the element or elements from the said group in the carrier.

3. A method as claimed in claim 1, wherein the carrier material essentially consists of copper, silver or gold.

4. A method as claimed in claim 1, wherein the base material together and in contact with the carrier material is mechanically treated to form the desired shape and dimensions of the final superconducting member prior to carrying out the heat treatment under which the base material reacts with the element or elements from the said group.

References Cited

UNITED STATES PATENTS 3,218,693 11/1965 Allen et al. ........ 29—599
3,397,084 8/1968 Krieglstein ........ 29—194 X
3,537,827 11/1970 Benz et al. ........ 29—194
3,353,008 11/1967 Fairbanks ........ 335—216 X
3,458,293 7/1969 Schindler ........ 29—194
3,574,573 4/1971 Tachikawa et al. ........ 29—194 X
3,625,662 12/1971 Roberts et al. ........ 29—194 X
3,661,639 5/1972 Caslaw ........ 29—599 X

FOREIGN PATENTS 1,021,548 3/1966 Great Britain ........ 29—599
1,025,715 4/1966 Great Britain ........ 29—599
1,039,316 8/1966 Great Britain ........ 29—599

CHARLES W. LANHAM, Primary Examiner

D. C. REILEY III, Assistant Examiner

U.S. Cl. X.R.

29—194, 599; 148—11.5 A, 127; 174—126 CP, DIG. 6; 335—216